United States Patent [19]

Brower et al.

[11] 4,336,570
[45] Jun. 22, 1982

[54] RADIATION SWITCH FOR PHOTOFLASH UNIT

[75] Inventors: Boyd G. Brower, Williamsport; Gary L. Houseknecht, Hughesville, both of Pa.

[73] Assignee: GTE Products Corporation, Stamford, Conn.

[21] Appl. No.: 148,119

[22] Filed: May 9, 1980

[51] Int. Cl.³ .............................................. G03B 15/02
[52] U.S. Cl. .......................................... 362/4; 362/6; 362/11; 200/61.02; 200/265; 252/518; 431/359
[58] Field of Search .................... 252/518, 514, 520; 431/359; 200/61.02, 265, DIG. 36; 362/4, 6, 13, 14, 115, 11

[56] References Cited

U.S. PATENT DOCUMENTS

| | | | |
|---|---|---|---|
| 3,458,270 | 7/1969 | Ganser et al. | 431/359 |
| 3,894,226 | 7/1975 | Hanson | 362/6 |
| 3,951,582 | 4/1976 | Holub et al. | 252/518 |
| 3,969,065 | 7/1976 | Smialek | 252/518 |
| 3,969,066 | 7/1976 | Smialek et al. | 252/518 |
| 3,988,647 | 10/1976 | Bolon et al. | 431/359 |
| 3,990,142 | 11/1976 | Weglin | 29/848 |
| 3,990,832 | 11/1976 | Smialek et al. | 431/359 |
| 3,990,833 | 11/1976 | Holub et al. | 252/518 |
| 4,017,728 | 4/1977 | Audesse et al. | 362/13 |
| 4,080,155 | 3/1978 | Sterling | 362/13 |
| 4,087,233 | 5/1978 | Schaffer | 431/359 |
| 4,156,269 | 5/1979 | Armstrong | 362/5 |
| 4,164,007 | 8/1979 | Audesse et al. | 362/13 |
| 4,182,607 | 1/1980 | Collins et al. | 431/359 |
| 4,182,608 | 11/1980 | Chevali et al. | 252/514 |
| 4,908,945 | 7/1978 | Oehmke | 252/514 |

*Primary Examiner*—Donald P. Walsh
*Attorney, Agent, or Firm*—Edward J. Coleman

[57] ABSTRACT

A photoflash unit having a plurality of flashlamps mounted on a printed circuit board containing circuitry for sequentially igniting the flashlamps in response to successive firing pulses applied thereto. The circuitry includes a plurality of solid-state switches capable of being activated by radiant energy generated during flashing of lamps located adjacent to respective switches. Initially, each of the switches has a resistance sufficiently high to provide an open circuit to the applied firing pulses, and after being activated by radiation, the switch undergoes chemical conversion to a conductive state over a finite time interval. The switches are prepared from compositions comprising admixtures of silver carbonate and/or silver oxide, silver-coated glass beads and a binder; the admixtures may also include electrically non-conductive particulate solids, such as titanium dioxide, and/or silver-coated metal beads. The constituents and proportions of the switch compositions are selected to provide a predetermined conversion time of twelve milliseconds or greater, thereby permitting reliable functioning with comparatively long duration, low voltage firing pulses.

10 Claims, 4 Drawing Figures

RADIATION SWITCH FOR PHOTOFLASH UNIT

BACKGROUND OF THE INVENTION

This invention relates to multilamp photoflash devices having circuit means for sequentially igniting the flashlamps and, more particularly, to improved means for permitting reliable flashing of an array of photoflash lamps, particularly arrays operated by comparatively long duration, low voltage firing pulses.

Numerous multilamp photoflash arrangements with various types of sequencing circuits have been described in the prior art, particularly in the past few years. Series and parallel-connected lamp arrays have been shown which are sequentially fired by mechanical switching means, simple electrical circuits, switching circuits using the randomly varied resistance characteristics of the lamps, arc gap arrangements, complex digital electronic switchin circuits, light-sensitive switching means and heat-sensitive switching devices which involve melting, fusing or chemical reaction in response to the radiant energy output of an adjacently located flashlamp. The present invention is concerned with an improved radiant-energy-activated switching means useful in a relatively inexpensive photoflash unit of the disposable type. In particular, the present switching means is particularly advantageous in photoflash arrays emloying lamps adapted to be ignited sequentially by successively applied firing pulses from a low voltage source.

A currently marketed eight-lamp photoflash unit employing radiation switches is described in U.S. Pat. Nos. 3,894,226 and 4,017,728 and referred to as a flip flash. A ten lamp version is described in U.S. Pat. Nos. 4,156,269 and 4,164,007. The unit comprises a planar array of high voltage flashlamps mounted on a printed circuit board with an array of respectively associated reflectors disposed therebetween. The circuit board comprises an insulating sheet of plastic having a pattern of conductive circuit traces, including terminal contacts, on one side. The flashlamp leads are electrically connected to the circuit traces, such as by means of eyelets, and the circuitry on the board includes a plurality of solid state switches that chemically change (convert) from a high to low resistance so as to become electrically conducting after exposure to the radiant heat energy from an ignited flashlamp operatively associated therewith. The purpose of the switches is to promote lamp sequencing and one-at-a-time flashing.

One type of solid state switch which operates in this manner is described in U.S. Pat. No. 3,458,270 of Ganser et al, in which the use of silver oxide in a polyvinyl binder is taught as a normally open radiant energy switch. Upon radiant heating, the silver oxide decomposes to give a metallic silver residue which is electrically conductive. Silver carbonate has also been used in lieu of or together with silver oxide. For example, U.S. Pat. No. 3,990,833, Holub et al, describes a mass of a composition comprising silver oxide, a carbon-containing silver salt and a humidity resistant organic polymer binder, the switch mass being deposited on a circuit board so as to interconnect a pair of spaced apart electrical terminals formed by the printed circuitry thereof. A similar type radiation switch exhibiting an even greater humidity resistance at above normal ambient temperatures is described and claimed in U.S. Pat. No. 3,990,832, Smialek et al, which describes the use of a particular stabilizer additive, such as an organic acid, to preclude or reduce the tendancy of the silver source in the switch material from premature conversion to a low electrical resistance when exposed to ambient humidity conditions. U.S. Pat. No. 3,951,582, Holub et al, describes a similar type switch with a colored coating, and U.S. Pat. No. 4,087,233, Shaffer, describes a switch composition comprising silver carbonate, a binder, and an oxidizer such as barium chromate, which is particularly resistant to high relative humidity and above normal ambient temperatures. U.S. Pat. No. 3,969,065, Smialek, describes a solid state switch comprising a mixture of solid copper salt with a humidity resistant organic polymer binder and a finely divided metal reducing agent, and a U.S. Pat. No. 3,969,066, Smialek et al, describes a switch comprising a mixture of finely divided cupric oxide with a humidity resistant organic polymer binder.

The use of a glass bead filler in a solid state switch is described in U.S. Pat. No. 4,080,155 of Sterling for preventing the switch material from being burned off or blown off the circuit board. An improved switch composition which avoids these problems is described in copending application Ser. No. 021,398, filed Mar. 19, 1979, and assigned to the present assignee. The improved burn-off prevention and reduced heat absorption are attained by replacing part of the silver carbonate and/or silver oxide in the switch composition with a proportion of electrically nonconductive inert particulate solids which comprise as much as 25-65% by weight of the total dried composition.

All of the aforementioned switch compositions have been described with respect to use in photoflash arrays employing high voltage type lamps adapted to be ignited sequentially by successively applied high voltage firing pulses from a source such as a camera-shutter-actuated piezoelectric element. Accordingly, none of these prior patents or applications mention a specific switch closure interval, i.e., the time of conversion from a high electrical resistance to a low electrical resistance upon exposure to radiation emitted from an adjacent flashlamp. Consideration of such switch closure, or conversion, time has not been necessary in a high voltage piezo-fired array since the electrical firing pulse duration is less than 10 microseconds, whereas the normally open radiation switch is not activated until 5-10 milliseconds; i.e., the conversion time is 5 to 10 milliseconds. If it is desired to use such normally open radiation switches in a low voltage photoflash array intended for operation with a typical camera actuated, battery powered pulse source, the reliability of proper lamp sequencing can be adversely affected. In a low voltage array, the electrical pulse duration can extend to a period longer than the conversion time of the normally open radiation switch. If the pulse duration is long enough, a second lamp will inadvertently flash, thereby causing the loss of that lamp in the intended useful sequence of lamp operation. Accordingly, it is desirable to have a normally open radiation switch that will activate (be converted) after the camera pulse has ended. By way of specific example, consider a low voltage camera having a pulse duration which varies from 4 to 10 milliseconds. In such an application, a switch conversion time of greater than about 12 milliseconds would be required. For these purposes, switch conversion time is defined as the elapsed time between the start of the firing pulse, and thus the high electrical resistance (open circuit) state of the switch mass, and the time at which the switch resistance reaches a predetermined low resistance state, which functions as a closed circuit in the operating application.

SUMMARY OF THE INVENTION

Accordingly, it is an object of the present invention to provide a photoflash unit having improved switching means for permitting reliable flashing of an array of photoflash lamps.

A principle object of the invention is to provide an improved, normally open radiation-actuated electrical switch for use in devices such as photoflash arrays and in which the switch composition is formulated to provide a predetermined conversion time of about 12 milliseconds or greater.

A further object is to provide an improved solid-state switch composition which more readily facilitates control of switch conversion time.

These and other objects, advantages and features are attained, in accordance with the invention, by appropriate selection of the composition of the switch admixture to provide a predetermined conversion time of about 12 milliseconds or greater. A preferred conversion time is from about 12 to 19 milliseconds. Typically the switch admixture comprises silver carbonate and/or silver oxide, silver-coated glass beads, and a binder. The use of a selected proportion of silver-coated glass beads as a conductivity-enhancing filler in a silver compound switch is described in copending application Ser. No. 148,358 filed concurrently herewith and assigned to the present assignee.

According to one embodiment of the invention, the proportion of binder in the dried composition by weight of the admixture is in the range of 10% to 15%, and the conversion time and resistance of the switch after conversion are directly related to the proportion of binder. In another embodiment, the proportion of silver carbonate in the dried composition by weight of the admixture is in the range of 45% to 0%, and the proportion of silver oxide in the dried composition by weight of the admixture is in the range of 0% to 45%; in this case, the conversion time and resistance of the switch after conversion are directly related to the proportion of silver carbonate replacing silver oxide in the mixture. In yet another embodiment, the switch admixture further includes 11% to 40% of electrically non-conductive inert particulate solids comprising one or more members selected from the group consisting of titanium dioxide, aluminum dioxide, aluminum phosphate, barium sulfate, and silicon dioxide. In this instance, the conversion time and the resistance of the switch after conversion are directly related to the proportion of the inert particulate replacing silver carbonate and/or silver oxide in the mixture; accordingly, this approach is not suitable for applications when the maintenance of a very low post-conversion resistance is critical. In yet another embodiment, the composition of the switch admixture further includes 50% to 60% silver-coated metal beads, and the conversion time of the switch is directly related to the proportion of silver-coated metal beads replacing silver-coated glass beads in the mixture. The resistance of such a switch after conversion, however, is inversely related to the proportion of silver-coated metal beads replacing silver-coated glass beads in the mixture.

BRIEF DESCRIPTION OF THE DRAWINGS

This invention will be more fully described hereinafter in conjunction with the accompanying drawings in which.

DESCRIPTION OF PREFERRED EMBODIMENT

Figure 1:
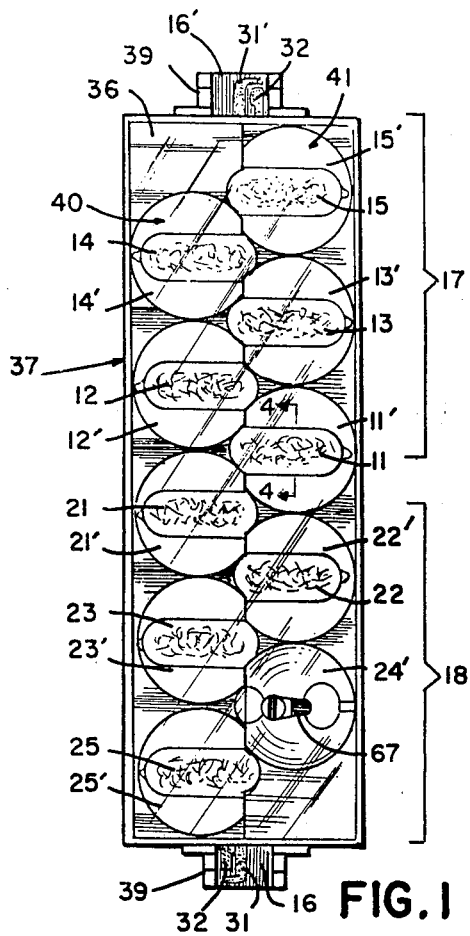
FIG. 1 is a front elevation of a multilamp photoflash unit in which the present invention is employed.

FIG. 1 illustrates a multilamp photoflash unit of the general type described in the aforementioned U.S. Pat. No. 4,164,007. This unit is similar in general operation to that described in the aforementioned U.S. Pat. No. 4,017,728, except that the construction has been modified to include additional lamps in a housing having the same outer dimensions. Whereas the unit described in U.S. Pat. No. 4,017,728 included a planar array of eight flashlamps (two groups of four) with associated reflector cavities provided in a single reflector member, the present unit comprises a planar array of ten flashlamps 11–15 and 21–25 mounted on a printed circuit board 43 (see FIG. 2) with an array of respectively associated reflector cavities 11'–15' and 21'–25' disposed therebetween. For low voltage pulse operation, the lamps can be of the filament type. Lamp 24 is omitted in FIG. 1 to show reflector cavity 24', which is typical of all the reflector cavities. The lamps are horizontally disposed and mounted in two parallel columns, with the lamps of one column staggered relative to the lamps of the other column. Each of the lamps has a pair of lead-in wires (not shown) connected to the printed circuitry on board 43 by respective eyelets 11a and 11b, etc., or solder joints. The column of lamps 15, 13, 11, 22 and 24 are positioned with their respective bases interdigitated with the bases of the adjacent column comprising 14, 12, 21, 23 and 25, the bases of one column thereby facing the bases of the adjacent column. The reflector cavities are provided on a pair of strip-like panels 40 and 41 which are conveniently separable for assembly purposes. The array is provided with a plug-in connector tab 16 at the lower end thereof which is adapted to fit into a camera or flash adaptor. A second plug-in connector tab 16' is provided at the top end of the unit, whereby the array is adapted to be attached to the camera socket in either of two orientations, i.e., with either the tab 16 or the tab 16' plugged into the socket. The lamps are arranged in two groups of five disposed on the upper and lower halves, respectively, of the elongated, rectangular-shaped array. Upper group 17 comprises lamps 11–15 and lower group 18 includes lamps 21–25; the reflector cavities 11', etc., are disposed behind the respective lamps so that as each lamp is flashed, light is projected forwardly of the array. The lamps are arranged and connected so that when the array is connected to a camera by the connector tab 16 only the upper group 17 of lamps will be flashed. By this arrangement, only lamps relatively far from the camera lens axis are flashable, thus reducing the undesirable "red-eye" effect.

The construction of the array comprises front and back housing members 36 and 37 (only the outer periphery of the back housing member is visible in FIG. 1), which preferably are made of plastic and are provided with interlocking members (not shown) which can be molded integrally with the housing members and which lock the housing members together in final assembly to form a unitary flash array structure. The front housing member 36 is a rectangular concavity and the back housing member 37 is substantially flat and includes integral extensions 39 and 39' at the ends thereof which partly surround and protect the connector tabs 16 and 16' and also function to facilitate mechanical attachment to the camera socket. Sandwiched between the front and back housing members 36 and 37, in the order named, are the flashlamps 11, etc., the pair of adjacent strip-like reflector panels 40 and 41 (preferably each being aluminum-coated plastic molding) shaped to provide the individual reflector cavities 11' etc., a transparent electrically insulating sheet 42 (shown only in FIG. 4), the printed circuit board 43 provided with integral connector tabs 16 and 16', and an indicia sheet (not shown) which may be provided with information and trademarks, and other indicia such as flash indicators located behind the respective lamps and which change color due to heat and/or light radiation from a flashing lamp, thus indicating at a glance which of the lamps have been flashed and not flashed.

Window means, such as openings 67, are provided in each of the reflector cavities 11', etc., behind the lamp aligned therewith. The circuit board 43 is provided with corresponding openings 30 to facilitate radiation from the flashlamps reaching the flash indicators. The rear housing member 37 is transparent (either of clear material or provided with window openings) to permit viewing of the indicia on the indicia sheet. The front housing member 36 is transparent, at least in front of the lamps 11, etc., to permit light from the flashing lamps to emerge forwardly of the array, and may be tinted to alter the color of the light from the flashlamps.

The height and width of the rectangular array are substantially greater than its thickness, and the height and width of the reflector panels 40, 41, the insulating sheet 42, and the circuit board 43 are substantially the same as the interior height and width of the housing member 36 to facilitate holding the parts in place.

Figure 2:
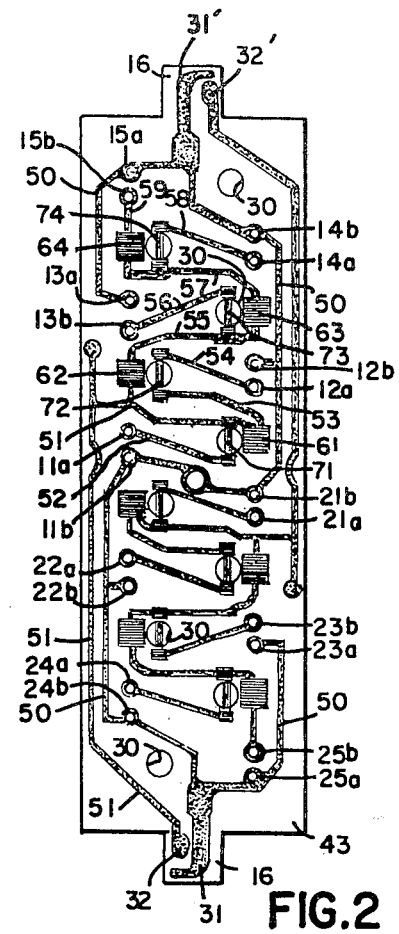
FIG. 2 is a front elevation of a circuit board used in the unit of FIG. 1, the circuit board including radiation connect switches in accordance with the invention.

Referring to both FIGS. 1 and 2, the tab 16, which is integral with the circuit board 43, is provided with a pair of electrical terminals 31 and 32, and similarly the tab 16' is provided with a pair of terminals 31' and 32', for contacting terminals of a camera socket for applying firing voltage pulses to the array. The circuit board 43 has a "printed circuit" thereon, as shown in FIG. 2, for causing sequential flashing of the lamps by firing voltage pulses applied to the terminals 31, 32, 31' and 32'. The top and bottom halves of the printed circuitry preferably are reverse mirror images of each other. The lead wires (not shown) of the lamps 11 etc., (FIG. 1) may be attached to the circuit board 43 in various ways such as by means of crimped metal eyelets 11a, 11b, etc., placed through openings in the board or, as preferred for low voltage circuits, by solder joints to conductive pads forming part of the circuit pattern.

The circuit located on the upper half of the circuit board of FIG. 2 and activated by the pair of input terminals 31 and 32 includes five lamps 11-15 arranged in parallel across the input terminals and four normally closed (N/C) radiant-energy-activated disconnect switches 71, 72, 73 and 74 each connected in series with a respective one of the lamps 11-14. Each N/C disconnect switch is responsive to the flashing of the lamp with which it is series-connected to form an open circuit. The circuit also includes four normally open (N/O) radiant-energy-activated connect switches 61 62, 63 and 64 for providing sequential flashing of the lamps 11-15 in response to firing pulses successively applied to the input terminals 31 and 32. Each N/O connect switch is responsive to the flashing of an associated lamp to form a closed circuit condition. One terminal (lead-in wire) of each of the lamps 11-15 is connected in common by means of an electrical "ground" circuit run 50 to input terminal 31. The "ground" circuit run 50 includes the terminals 31 and 31' and makes contact with one of the connector junctions for each of the lamps.

As described in the previously referenced U.S. Pat. No. 4,017,728, Audesse et al, each of the N/C disconnect switches 71-74 comprises a length of electrically conductive, heat shrinkable, polymeric material which is attached to the circuit board at both ends, with its midportion spatially suspended over an aperture 30 to avoid contact with the heat absorbing surfaces of the circuit board. This arrangement maximizes the speed with which the shrinking and separation of the midportion of the switch element occurs upon its bein heated by the radiant output of an ignited flashlamp.

The first lamp to be fired, namely, lamp 11, is connected directly across the input terminals 31 and 32 via the N/C disconnect switch 71. The second through fourth N/O connect switches, namely, 62, 63 and 64 are series connected in that order with lamp 15, which is the fifth and last lamp to be fired, across the input terminals 31 and 32. Further, the third lamp to be fired (lamp 13) is series connected with N/O switch 62, and the fourth lamp to be fired (lamp 14) is connected in series with N/O switch 63.

In order to limit the resistance build-up caused by additional series N/O switches, and any possible circuit discontinuity caused by misplacement of the first N/C switch 71, the first N/O switch to be activated (switch 61) is series-connected with the second lamp to be fired (lamp 12) across the input terminals 31 and 32 but parallel-connected with the above-mentioned series combination of N/O switches 62-64 and lamp 15.

Terminal 32 is part of a conductor run 51 that terminates at three different switches, namely, the N/C disconnect switch 71, the N/O connect switch 61, and the N/O connect switch 62. The other side of switch 71 is connected to lamp 11 via circuit run 52 and eyelet (or solder junction) 11a. Circuit run 53 connects switches 61 and 72, and circuit run 54 connects the other side of switch 72 to lamp 12 via eyelet (or solder junction) 12a. A circuit run 55 interconnects switches 62, 73 and 63 while the other side of switch 73 is connected to lamp 13 via circuit run 56, and eyelet (or solder junction) 13b. Switches 63, 74 and 64 are interconnected by a circuit run 58 and eyelet (or solder junction) 14a. Finally, a circuit run 59 connects the other side of switch 64 to lamp 15 via eyelet (or solder junction) 15b.

For high voltage pulse source applications, the aforementioned circuit runs have typically comprised a silk-screened pattern of silver-containing conductive material. The compositions of the N/O connect switch material according to the present invention and copending application Ser. No. 148,358 however, permit use of a circuit board 43 having circuit runs formed of die-stamped aluminum, thereby providing significant cost advantages. For example, U.S. Pat. No. 3,990,142 describes a die-stamped printed circuit board, and copending applications Ser. Nos. 131,614 and 131,711 both filed Mar. 19, 1980 and assigned to the present assignee, describe die-stamped circuit boards for photoflash devices. If operation from a low voltage pulse source is intended, the circuit runs of FIG. 2 are typically formed of copper, either etched or die-stamped.

Figure 3:
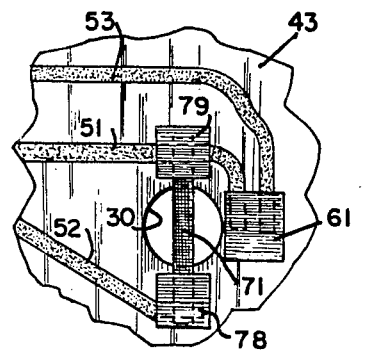
FIG. 3 is an enlarged fragmentary detal view of a proportion of the circuit board of FIG. 2 showing the switching arrangement associated with one of the lamps.
Figure 4:
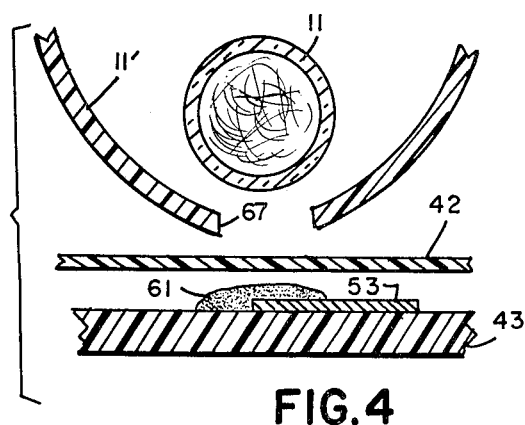
FIG. 4 is an enlarged fragmentary schematic cross-sectional view taken along 4—4 of FIG. 1.

The radiant-energy-activated N/O connect switches 61-64 are in contact with and bridge across the circuit runs that are connected to them. More specifically, each N/O switch comprises a mass of material interconnected to a pair of spaced apart electrical terminals in the circuits. FIGS. 3 and 4 illustrate this for switch 61. The material for the connect switch is selected to be of the type initially having an open circuit or high resistance, the resistance thereof becoming converted to a lower value when the material receives radiation in the form of heat and/or light from a respective adjacent lamp, upon the lamp being flashed. For this purpose, each of the connect switches is respectively positioned behind and near to an associated flashlamp 11-14. To facilitate radiation transfer from the flashlamp to its corresponding N/O connect switch, each of the reflectors includes a window means, such as an opening 67, in alignment with the respective radiation connect switch. Each of these connect switches has a composition according to the invention, as will be described hereinafter, and upon receiving heat and/or light radiation from the adjacent lamp when it is flashed, converts from an open circuit (high resistance) to a closed circuit (lower resistance) between its switch terminals on the circuit board.

As described in U.S. Pat. No. 4,130,857, Brower, the high resistance material employed in providing the N/O connect switches 61-64 is also disposed on and about each of the ends of the N/O disconnect switches. For example, as illustrated in FIG. 3, the disconnect switch 71 is attached to circuit board 43 so as to extend laterally across aperture 30 with respect to the lamp. Conductive trace 53 extends to provide one electrical terminal for a connect switch 61 while a trace 51 provides the other connect switch terminal. In addition, trace 51 is carried over one end of strip 71, and trace 52 contacts the other end of strip 71. In this instance, patches 78 and 79 of high resistance material cover each end of the conductive strip 71 to shield the circuit run carry-over regions from abrasion during the manufacturing process and further secure the strip to the circuit board. In addition to this mechanical protection, the high resistance patches 78 and 79 provide insulation to prevent shorting or spark-over between the strip ends and the nearby circuit traces 53 and 50 (also see FIG. 2). In this position, the patches 78 and 79 are masked by the reflector during flashing. Although there are other methods of insulating the disconnect switch ends, such as by a coat of insulating resin, use of connect switch paste eliminates a production process by combining the switch-depositing step and the insulating step.

As has been explained, the lower portion of the circuit board contains a substantially reverse mirror image of the same circuitry shown in the upper part of the circuit board, and therefore will not be described in detail. It will be noted that the circuit runs from the plugged in terminals 31 and 32 at the lower part of the circuit board extend upwardly so as to activate the circuitry in the upper half of the circuit board. Similarly when the unit is turned around and tab 16' is plugged into a socket, the circuit board terminals 31' and 32' will be connected to activate the lamps which then will be in the upper half of the circuit board, and hence in the upper half of the flash unit. This accomplishes the desirable characteristic whereby only the group of lamps relatively farthest away from the lens axis will be flashed, thereby reducing the possibility of the phenomenon known as "red-eye".

The circuit on the circuit board 43 functions as follows. Assuming that none of the five lamps in the upper half of the unit have been flashed, upon occurrence of the first firing pulse applied across terminals 31 and 32, this pulse will be directly applied to the lead-in wires of the first connected flashlamp 11, whereupon the lamp 11 flashes and becomes an open circuit between its lead-in wires. Heat and/or light radiation from the flashing first lamp 11 is operative via its respective reflector aperture to activate the N/C disconnect switch 71 and the N/O connect switch 61. As a result, the normally closed disconnect switch 71 is operative in response to the radiation from the lamp to rapidly provide a reliable open circuit to high voltages and thus electrically remove lamp 11 from the circuit, whereby the subsequent lamps 12-15 are unaffected by short circuiting or residual conductivity in lamp 11. The radiation causes the normally open connect switch 61 to become a closed circuit (or a low value of resistance), thereby connecting the circuit board terminal 32 electrically to the second lamp 12 via the normally closed disconnect switch 72. By the time this occurs, the firing pulse should have diminished to a value insufficient to cause the second lamp 12 to flash. Accordingly, to assure reliable operation in this respect, the composition of the normally open connect switch mass is selected to provide a predetermined minimum conversion time, as shall be described hereinafter.

When the next firing pulse occurs, it is applied to the lead-in wires of the second lamp 12 via the now closed connect switch 61 and disconnect switch 72, whereupon the second lamp 12 flashes, thereby causing disconnect switch 72 to rapidly provide an open circuit and causing connect switch 62 to assume a low resistance. Once switch 62 has been activated the resistance of the N/O connect switch 61 is bypassed along with any potential discontinuity caused by the N/C disconnect switch 71. When the next firing pulse occurs, it is applied via now closed connect switch 62 and disconnect switch 73 to the third lamp 13, thereby firing that lamp, whereupon the radiation from lamp 13 activates disconnect switch 73 to rapidly provide an open circuit and causes connect switch 63 to become essentially a closed circuit across its terminals. The next firing pulse applied, via now closed connect switch 63 and disconnect switch 74 to the lead-in wires of the fourth flashlamps 14, thereupon causing the lamp to flash. The radiation from lamp 14 activates the disconnect switch 74 to rapidly provide an open circuit and causes connect switch 64 to become essentially a closed circuit across its terminals. Thus, the next firing pulse will be applied, via now closed connect switch 64 to the lead-in wires of the fifth flashlamp 15, thereupon causing the lamp to flash. Since this lamp is the last lamp in the active circuit, it does not matter whether its lead-in wires are an open or closed circuit after flashing. When the flash unit is turned around and the other connector tab 16' attached to the camera socket, the group 18 of the lamps that then becomes uppermost and farthest away from the lens axis will be in the active circuit and will be flashed in the same manner as has been described. In a low voltage embodiment, the lamps 11, etc., are of the filament type and the firing pulses are provided from a camera-actuated battery supply of a few volts, e.g., 3 to 45 volts having a pulse duration of up to ten milliseconds.

In accordance with the present invention, each of the solid-state radiation connect switches 61-64 is a dried mass of material having a selected composition comprising an admixture of silver-carbonate and/or silver oxide, silver-coated glass beads and a binder, such as polystyrene resin. The coated glass beads can be selected to have a silver content of from about 4% to 12% as a dried weight proportion of the beads. Such glass beads are commercially available, e.g., from Potters Industries Incorporated, Hasbrouck, N.J., in the form of spheres, spheroids, or oblong spheroids having an average diameter of 6–125 microns and preferably 10–50 microns average diameter. The composition may further include fillers and stabilizers. For example, a proportion of barium chromate may be included to enhance environmental stability as described in U.S. Pat. No. 4,087,233. Further, for high voltage circuit applications, the switch composition may include a high proportion of non-conductive inert particulate solids by use of a filler, such as titanium dioxide, as described in copending application Ser. No. 021,398 filed Mar. 19, 1979 and assigned to the present assignee. Other inert fillers that can be used are aluminum oxide, aluminum phosphate, barium sulfate, and silicon dioxide. In accordance with yet another aspect of the invention, the switch composition may further include a selected proportion of silver-coated metal beads. Such metal beads are commercially available, e.g., from Boronite, Bloomfield, N.J.; we prefer substrate metals of copper or nickel coated with about 6% silver and having a bead size of 200 mesh or finer.

As described hereinbefore, the firing pulse duration from a camera-actuated low voltage (e.g., 3 to 45 volts) battery source, according to one application embodiment, varies from 4 to 10 milliseconds. We have found that for reliable operation of a photoflash array from such a low voltage pulse source, the conversion time for the normally open radiation switch should be greater than about 12 milliseconds, and preferably lie in the range from 12 to 19 milliseconds. As previously stated, conversion time may be defined as the elapsed time between the start of a firing pulse, when the switch mass has a sufficiently high electrical resistance to present an open circuit, and the time at which the switch resistance reaches a sufficiently low value to present a closed circuit, e.g, about 0.5 ohms or less in a low voltage operated circuit.

According to the present invention, the desired switch conversion time can be predetermined by appropriate selection of the constituents and proportions of the switch composition.

For example, an increase in the percentage of binder increases the conversion time and increases the final resistance of the switch. Although a range of 12% to 14% binder is optimum, the binder can be varied from 10% to 15%, according to the requirements of timing and resistance of the flash system. A specific example of the aforementioned effects is illustrated in Table 1 below, wherein the binder employed is polystyrene resin.

TABLE I

| % $Ag_2CO_3$ | % Ag-Coated beads | % Binder Dry Wgt. | Timing msec. | Post Conversion Resistance Ohm |
|---|---|---|---|---|
| 50 | 40 | 10 | 9.8 | 0.07 |
| 50 | 35* | 15 | 15.7 | 0.15 |

*Note that a change in the percentage of silver-coated glass beads did not significantly change the timing characteristics of the switch, in a test designed to check that possibility.

Replacing silver oxide with silver carbonate slows the switch conversion time and increases the switch resistance. A mixture of the two silver compounds results in timing and resistance characteristics somewhere between the two extremes. The change in timing in this instance is believed to result from the silver carbonate having to breakdown into silver oxide and then into metallic silver, rather than breaking down directly into metallic silver as does the silver oxide. The change in resistance results from the higher percentage of metallic silver per given weight of silver oxide, as compared to the percent of metallic silver in silver carbonate. A specific example of the aforementioned effects is illustrated in Table 2 below.

TABLE 2

| % $Ag_2CO_3$ | % $Ag_2O$ | % Ag-Coated Beads | % Binder | Timing msec. | Post Conversion Resistance Ohm |
|---|---|---|---|---|---|
| 45.0 | 0.0 | 40 | 15.0 | 16.9 | 0.64 |
| 22.5 | 22.5 | 40 | 15.0 | 16.2 | 0.53 |
| 0.0 | 45.0 | 40 | 15.0 | 12.2 | 0.29 |

The addition of an inert filler slows the switch conversion time and increases switch resistance. Hence, this can be used only where the need for a very low post conversion resistance is not critical. As a specific example, titanium dioxide was used as a filler and the results are illustrated in Table 3 below.

TABLE 3

| % $Ag_2CO_3$ | % Ag-Coated Beads | % $TiO_2$ | % Binder | Timing msec. | Post Conversion Resistance Ohm |
|---|---|---|---|---|---|
| 50.0 | 40.0 | 0.0 | 10.0 | 9.8 | 0.07 |
| 40.0 | 40.0 | 10.0 | 10.0 | 10.9 | 0.10 |
| 30.0 | 40.0 | 20.0 | 10.0 | 16.3 | 0.45 |

Replacing the silver-coated glass beads with silver-coated metal beads was discovered to slow the switch conversion time but to decrease switch resistance. The increase in switch conversion time can be attributed to the heat-sinking effect of the metal beads as compared to the glass beads. The decrease in resistance results from the metal being a conductor, while the glass beads are an insulator without the silver coating. Note that Table 4 below shows a higher percentage of silver-coated metal beads when measured by weight, but the silver-coated metal beads and the silver-coated glass beads are of equal volume. This factor also affects the weight percentage of binder, which is indicated as much lower in the metal bead composition even though approximately equivalent in volume to the binder employed in the glass bead composition (50-40-10). In this particular instance, the silver coated metal beads are 200 mesh or finer copper beads covered with 6% silver (Boronite #53-15).

TABLE 4

| % Ag$_2$CO$_3$ | % Ag-Coated Glass Beads | % Ag-Coated Metal Beads | % Binder | Timing msec. | Post Conversion Resistance Ohm |
| --- | --- | --- | --- | --- | --- |
| 50.0 | 40.0 | 0.0 | 10.0 | 9.8 | 0.07 |
| 34.0 | 0.0 | 59.0 | 6.8 | 12.2 | 0.02 |

In each of the above cases, the switch mixture was made into a paste by ball milling in a suitable solvent such as butyl cellosolve acetate. The solids content may be adjusted to suit the method of switch application. For silk screening over circuit boards, we prefer to adjust the solids content to about 74%. This mixture is deposited as a mass of material across respective conductor run terminations, as represented by patches 61–64. For example, FIGS. 3 and 4 illustrate switch 61 wherein such a mixture is deposited as a mass bridging conductor runs 53 and 51. Switches 61–64 having this patch composition consistently provided with desired conversion times and post-conversion resistance values across the respective conductor run terminations.

Although only polystyrene resin was mentioned herinbefore for use as a binder material, other useful binders include cellulose esters, cellulose ethers, polyalkylacrylates, polyalkylemethacrylates, styrene copolymers, vinyl polymers, and polycarbonate.

Accordingly, although the invention has been described with respect to specific embodiments it will be appreciated that modifications and changes may be made by those skilled in the art without departing from the true spirit and scope of the invention. For example, the described radiation switches are not limited to use in a planar photoflash array of the type illustrated but are equally suitable for use in photoflash units having linear arrays of lamps, whether of vertical or horizontal arrangement, powered by a connector having two or more terminals.

We claim:

1. A radiation switch for a photoflash unit which is capable of conversion from a high electrical resistance to a low electrical resistance over a finite time interval when exposed to radiation emitted from a flashlamp disposed adjacent to the switch, said switch comprising an admixture of silver carbonate and/or silver oxide, silver-coated glass beads, and a binder, wherein the composition of the mixture is selected to provide a predetermined conversion time of about 12 milliseconds or greater.

2. The radiation switch of claim 1 wherein said predetermined conversion time is in the range of about 12 to 19 milliseconds.

3. The radiation switch of claim 1 wherein the proportion of binder in the dried composition by weight of said admixture is in the range of 10% to 15% and said conversion time and the resistance of said switch after conversion are directly related to said proportion of binder.

4. The radiation switch of claim 1 wherein the proportion of silver carbonate in the dried composition by weight of said admixture is in the range of 45% to 0% and the proportion of silver oxide in the dried composition by weight of said admixture is in the range of 0% to 45%, and said conversion time and the resistance of said switch after conversion are directly related to the proportion of silver carbonate replacing silver oxide in said mixture.

5. The radiation switch of claim 1 wherein the composition of said switch admixture further includes 11% to 40% of electrically non-conductive inert particulate solids comprising one or more members selected from the group consisting of titanium dioxide, aluminum oxide, aluminum phosphate, barium sulfate, and silicon dioxide, and said conversion time and the resistance of said switch after conversion are directly related to the proportion of said inert particulate replacing silver carbonate and/or silver oxide in said mixture.

6. The radiation switch of claim 1 wherein the composition of said switch admixture further includes 50% to 60% silver-coated metal beads, and said conversion time of said switch is directly related to the proportion of silver-coated metal beads replacing silver-coated glass beads in said mixture, said resistance of said switch after conversion being inversely related to the proportion of silver-coated glass beads in said mixture.

7. In a multilamp photoflash unit comprising a pair of flashhlamps, an electrical circuit into which said lamps are arranged to fire individually and in sequence, and a solid state radiation switch located external of the lamps and forming part of said electrical circuit, said switch being located adjacent one of said flashlamps to receive radiant energy emitted by that flashlamp and being capable of conversion from a high electrical resistance to a low electrical resistance over a finite time interval upon receiving said emitted radiant energy, the improvement wherein said radiation switch comprises an admixture of material including silver carbonate and/or silver oxide, silver-coated glass beads, and a binder, wherein the composition of the mixture is selected to provide a predetermined conversion time of about 12 milliseconds or greater.

8. The photoflash unit of claim 7 wherein said radiation switch comprises a mass of said material interconnected to a pair of spaced-apart electrical terminals in the electrical circuit.

9. The photoflash unit of claim 8 wherein said electrical circuit is operated by a low voltage pulse source in the order of a few volts and having a maximum pulse length of about 10 milliseconds and said predetermined conversion time of said switch mass is in the range of about 12 to 19 milliseconds.

10. The photoflash unit of claim 7 wherein said switch admixture further includes silver-coated metal beads.

* * * * *